US012730138B2

(12) United States Patent
Oda et al.

(10) Patent No.: US 12,730,138 B2
(45) Date of Patent: Sep. 8, 2026

(54) ELECTRIC FIELD DISTRIBUTION FLUCTUATION PERIOD MEASURING METHOD AND ELECTRIC FIELD DISTRIBUTION FLUCTUATION PERIOD MEASURING DEVICE

(71) Applicant: NTT, Inc., Tokyo (JP)

(72) Inventors: Tomokazu Oda, Musashino (JP); Atsushi Nakamura, Musashino (JP); Daisuke Iida, Musashino (JP); Hiroyuki Oshida, Musashino (JP)

(73) Assignee: NTT, Inc., Tokyo (JP)

(*) Notice: Subject to any disclaimer, the term of this patent is extended or adjusted under 35 U.S.C. 154(b) by 723 days.

(21) Appl. No.: 18/016,908

(22) PCT Filed: Aug. 7, 2020

(86) PCT No.: PCT/JP2020/030339
§ 371 (c)(1),
(2) Date: Jan. 19, 2023

(87) PCT Pub. No.: WO2022/029995
PCT Pub. Date: Feb. 10, 2022

(65) Prior Publication Data
US 2023/0288466 A1 Sep. 14, 2023

(51) Int. Cl.
*G01R 29/08* (2006.01)
*H04B 10/073* (2013.01)
*H04B 10/2581* (2013.01)

(52) U.S. Cl.
CPC ....... *G01R 29/0885* (2013.01); *H04B 10/073* (2013.01); *H04B 10/2581* (2013.01)

(58) Field of Classification Search
CPC . H04B 10/2581; H04B 10/073; G01M 11/39; G01M 6/00; G01R 29/0885
See application file for complete search history.

(56) References Cited

FOREIGN PATENT DOCUMENTS

JP 2015169525 A * 9/2015

OTHER PUBLICATIONS

Kokubun, Yasuo, Multi-dimensional multi-level mode modulation with ultra-high spectral efficiency using higher order degenerate modes in optical fiber and machinegenerated English translation thereof. Jun. 13, 2018.

T. Oda et al., “Measurement of cross-sectional Brillouin gain in few-mode fiber by pulsed pump-probe BOTDA with image sensor”, Proc. 7th APOS, Wed_8, (2018).

An Li et al.,“Few-mode fiber based optical sensors”, Optics Express 2015, 23, pp. 1139-1150 pp. 1147-1150, fig. 7, 9 (2015).

* cited by examiner

*Primary Examiner* — Uzma Alam
(74) *Attorney, Agent, or Firm* — Harness, Dickey & Pierce, P.L.C.

(57) ABSTRACT

An electric field distribution variation cycle measuring apparatus and method involve measuring or estimating a variation cycle of an electric field distribution in an optical fiber. Pump light and probe light may be converted into a higher-order mode and cause the pump light to be incident on while end of the optical fiber and probe light to be incident on the other end of the optical fiber. A Brillouin gain of simulated Brillouin scattering may be acquired, where the stimulated Brillouin scattering is generated when the pump light and the probe light collide in the optical fiber. A variation cycle of the Brillouin gain may be set as a variation cycle of an electric field distribution of a higher-order mode.

4 Claims, 3 Drawing Sheets

(a) $LP_{11a} - LP_{11a}$ (b) $LP_{11a} - LP_{11b}$

ELECTRIC FIELD DISTRIBUTION FLUCTUATION PERIOD MEASURING METHOD AND ELECTRIC FIELD DISTRIBUTION FLUCTUATION PERIOD MEASURING DEVICE

CROSS-REFERENCE TO RELATED APPLICATIONS

This application is a 371 U.S. National Phase of International Application No. PCT/JP2020/030339, filed on Aug. 7, 2020. The entire disclosure of the above application is incorporated herein by reference.

TECHNICAL FIELD

The present disclosure relates to a measuring method and a measuring apparatus for measuring a variation cycle in the longitudinal direction of an electric field distribution of a higher-order mode propagating through an optical fiber.

BACKGROUND ART

In recent years, with rapid increase in transmission traffic, mode division multiplexing (MDM) communication using a few mode optical fiber (FMF) through which a plurality of spatial modes propagates has attracted attention. In the MDM communication, multiplexing is performed in a plurality of modes, but communication gets difficult in a case where mode-dependent loss (MDL) is large. Therefore, loss evaluation for each of the modes that occurs in an FMF transmission path is important. Furthermore, in optical fiber transmission, since loss occurs at a connection point between optical fibers, the loss for each of the modes needs to be evaluated in a distributed manner in the longitudinal direction of an optical fiber in order to evaluate the quality of each connection point after construction of the transmission path.

The loss generated at a connection point depends on electric field distributions of respective propagation modes propagating through an optical fiber. Here, in a case of a connection point of an FMF, since an electric field distribution of a fundamental mode is always constant at the time of propagation, the loss received at the connection point is also constant. On the other hand, in a case of a higher-order mode such as a linearly polarized $(LP)_{11}$ mode, an electric field distribution varies at the time of propagation, and thus, the loss received varies even in the same connection state. Therefore, when the quality of a connection point is evaluated, the loss can preferably be measured after the electric field distribution at the time of passing through each connection point being grasped.

Hitherto, as a method for acquiring information related to an electric field distribution in an FMF, a method for acquiring a Brillouin gain in an optical fiber cross-sectional direction has been proposed (Non Patent Literature 1). In this method, a Brillouin gain in an optical fiber cross-sectional direction generated when pump light incident from one side of an FMF and probe light incident from the other side collide in the FMF is measured using an image sensor. By this method, a cross-sectional gain corresponding to overlap of electric field distributions of the pump light and the probe light in the FMF can be acquired. Here, since the electric field distributions of the pump light and the probe light vary when the pump light and the probe light propagate through the FMF, what can be acquired from the cross-sectional gain is relative relation between the electric field distributions of the pump light and the probe light due to optical fiber propagation. By the gain amount being measured in a distributed manner in the longitudinal direction, a variation cycle of an electric field distribution by propagation can be acquired, and thus, an electric field distribution in the optical fiber can be estimated from the variation cycle and an electric field distribution of an incident higher-order mode.

CITATION LIST

Non Patent Literature

Non Patent Literature 1: T. Oda et al., Proc. 7th APOS, Wed_8 (2018).

SUMMARY OF INVENTION

Technical Problem

However, since the measurement in Non Patent Literature 1 uses an image sensor, there are issues that it takes time to perform measurement in the longitudinal direction of an optical fiber due to the limitation of the frame rate, and a variation cycle of an electric field distribution in an optical fiber is difficult to be estimated in a short time.

Therefore, in order to solve the above issues, an object of the present invention is to provide an electric field distribution variation cycle measuring method and an electric field distribution variation cycle measuring apparatus capable of estimating a variation cycle of an electric field distribution in an optical fiber in a short time.

Solution to Problem

In order to achieve the above object, an electric field distribution variation cycle measuring method according to the present invention is to measure a variation cycle of an electric field distribution in any higher-order mode propagating through an optical fiber by utilizing a fact that difference (deviation) in the electric field distributions between pump light and probe light that generate stimulated Brillouin scattered light appears in a Brillouin gain.

Specifically, an electric field distribution variation cycle measuring method according to the present invention is an electric field distribution variation cycle measuring method for measuring a variation cycle of an electric field distribution of any higher-order mode propagating through an optical fiber, the electric field distribution variation cycle measuring method including converting pump light and probe light having predetermined optical frequency difference from the pump light into the any higher-order mode, causing the pump light to be incident on one end of the optical fiber and the probe light to be incident on the other end of the optical fiber, acquiring a Brillouin gain of stimulated Brillouin scattering generated when the pump light and the probe light collide in the optical fiber in a distributed manner in a longitudinal direction of the optical fiber, and setting a variation cycle of the Brillouin gain in a longitudinal direction of the optical fiber as a variation cycle of an electric field distribution of the any higher-order mode.

Furthermore, an electric field distribution variation cycle measuring apparatus according to the present invention is an electric field distribution variation cycle measuring apparatus that measures a variation cycle of an electric field distribution of any higher-order mode propagating through an optical fiber, the electric field distribution variation cycle measuring apparatus including a mode multiplexing and demultiplexing device that converts pump light and probe light having predetermined optical frequency difference from the pump light into the any higher-order mode and causes the pump light to be incident on one end of the optical fiber and the probe light to be incident on the other end of the optical fiber, and a gain analysis device that acquires a Brillouin gain of stimulated Brillouin scattering generated when the pump light and the probe light collide in the optical fiber in a distributed manner in a longitudinal direction of the optical fiber and sets a variation cycle of the Brillouin gain in a longitudinal direction of the optical fiber as a variation cycle of an electric field distribution of the any higher-order mode.

In the present electric field distribution variation cycle measuring method and the apparatus, since stimulated Brillouin scattered light is received by an optical to electrical conversion element without an image sensor, high-speed measurement can be performed. Therefore, the present invention can provide an electric field distribution variation cycle measuring method and an electric field distribution variation cycle measuring apparatus capable of estimating a variation cycle of an electric field distribution in an optical fiber in a short time.

In the electric field distribution variation cycle measuring method and the apparatus according to the present invention, the Brillouin gain that is acquired is gain efficiency of a fundamental mode among excited acoustic wave components. Polarization dependence of the Brillouin gain can be reduced, and the variation of the electric field distributions of the pump light and the probe light can be easily detected.

Each of above inventions can be combined as far as possible. Furthermore, the electric field distribution variation cycle measuring apparatus according to the present invention can also be implemented by a computer and a program, and the program can be recorded in a recording medium or provided via a network.

Advantageous Effects of Invention

The present invention can provide an electric field distribution variation cycle measuring method and an electric field distribution variation cycle measuring apparatus capable of estimating a variation cycle of an electric field distribution in an optical fiber in a short time.

DESCRIPTION OF EMBODIMENTS

Figure 1:
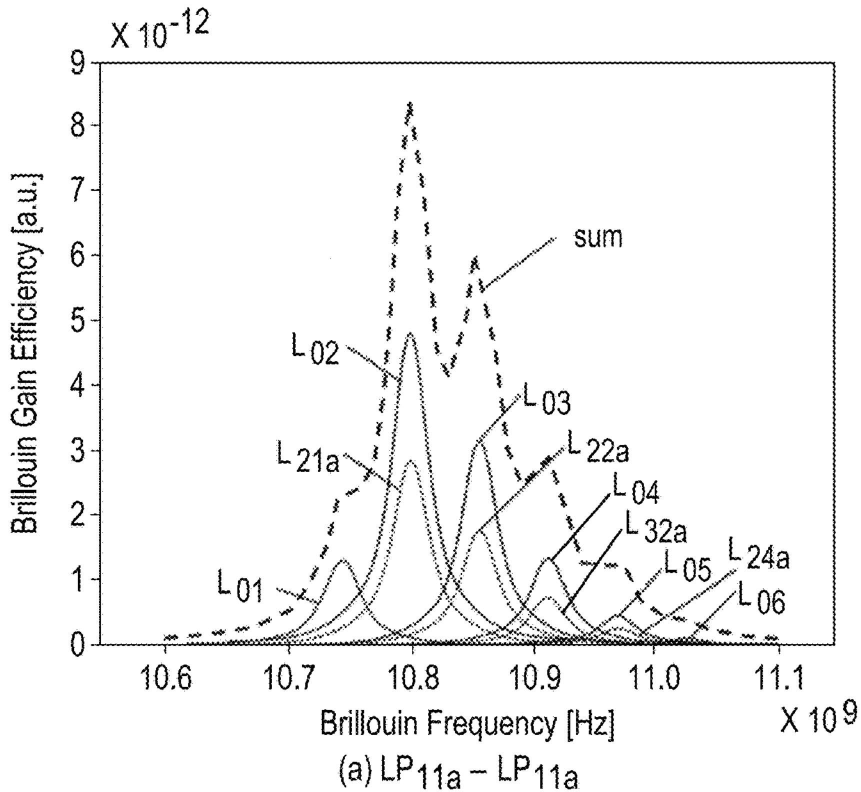
FIG. 1 is a diagram illustrating Brillouin gain spectrums caused by difference in electric field distributions in a propagation mode.
Figure 1:
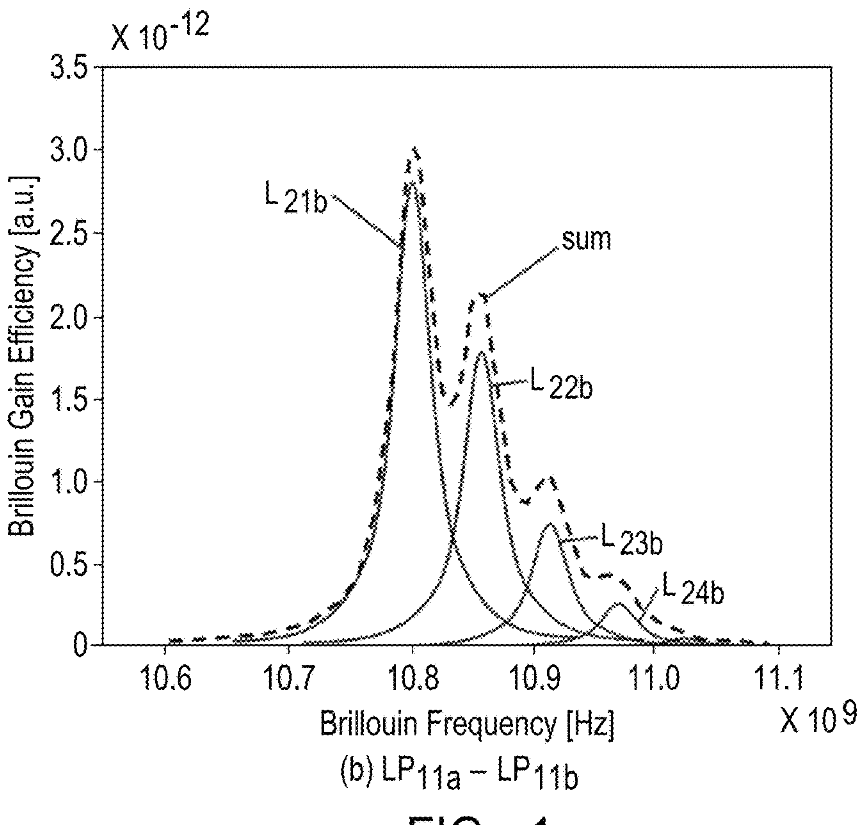

An embodiment of the present invention will be described with reference to the accompanying drawings. The embodiment described below is an example of the present invention, and the present invention is not limited to the following embodiment. Note that components having the same reference numerals in the present description and the drawings indicate the same components.

SUMMARY OF INVENTION

In the present invention, a Brillouin gain spectrum (BGS) of stimulated Brillouin scattered light generated in an optical fiber is measured. The observed BGS is determined by pump light, probe light, and overlap between acoustic modes excited by the pump light and the probe light, and in particular, in an FMF through which a higher-order mode propagates, a plurality of peaks is observed by a plurality of acoustic modes being excited. In the present invention, utilizing this characteristic, a spectral shape corresponding to overlap of electric field distributions of pump light and probe light is measured in a distributed manner in the longitudinal direction, thereby acquiring a variation cycle of an electric field distribution of a higher-order mode.

[BGS of Stimulated Brillouin Scattered Light]

The observed BGS will be described below.

Gain efficiency $G_m$ ($\Delta\nu$) formed by an acoustic mode having a mode order m (hereinafter, this is referred to as an $L_m$ mode) is a Lorentz function depending on frequency difference $\Delta\nu$ between pump light and probe light as described below.

[Math. 1]

$$G_m(\Delta\nu) = G_{0,m}\frac{(\nu_{BW,m}/2)^2}{(\Delta\nu-\nu_{B,m})^2+(\nu_{BW,m}/2)^2} \tag{1}$$

Here, $\nu_{BW,m}$ is the full width at half maximum (FWHM) of the Lorentz function formed by the $L_m$ mode, and is about 30-50 MHz in a case where the wavelength is 1.55 μm in an optical fiber formed from quartz. $\nu_{B,m}$ is the frequency of the $L_m$ mode and is expressed as follows.

[Math. 2]

$$\nu_{B,m} = \frac{\omega_{B,m}}{2\pi} \tag{2}$$

Here, $\omega_{B,m}$ is the angular frequency of the $L_m$ mode. $G_{0,m}$ is the maximum Brillouin gain amount by the $L_m$ mode, and is expressed by the following equation.

[Math. 3]

$$G_{0,m}=g[\iint A_m(r,\theta)E_p(r,\theta)E_s(r,\theta)rdrd\theta]^2 \tag{3}$$

Here, $A_m(r,\theta)$ is a cross-sectional distribution of an acoustic wave of the $L_m$ mode, $E_p(r,\theta)$ and $E_s(r,\theta)$ are electric field distributions of the pump light and the probe light, and each of the electric field distributions and the cross-sectional distribution of the acoustic wave is normalized as follows.

[Math. 4]

$$\iint A_m^2(r,\theta)rdrd\theta=1$$

$$\iint E_p^2(r,\theta)rdrd\theta=1$$

$$\iint E_s^2(r,\theta)rdrd\theta=1 \tag{4}$$

g is a gain coefficient determined by a wavelength and an effective refractive index. As illustrated in Equation (3), it can be seen that the maximum Brillouin gain amount depends on the acoustic mode and overlap between the pump light and the probe light.

Finally, the observed BGS is expressed by the sum of gain amounts by excited acoustic modes.

[Math. 5]

$$G(\Delta\nu) = \sum_m G_m(\Delta\nu) \quad (5)$$

From Equations (1) to (5), since a gain amount by each of the acoustic modes depends on the overlap of the electric field distributions of the pump light and the probe light, these pieces of information can be acquired by the BGS being acquired.

[BGS in Two-mode Optical Fiber]

Here, as an example, a case where both the pump light and the probe light are an $LP_{11}$ mode in a two-mode optical fiber will be considered. The $LP_{11}$ mode is a degenerate mode including two that are $LP_{11a}$ and $LP_{11b}$, and has a characteristic that the electric field distribution varies by propagation in an optical fiber. Here, since overlap of the electric field distributions is different between a case where the pump light and the probe light are both $LP_{11a}$ and a case where the pump light and the probe light are $LP_{11a}$ and $LP_{11b}$, respectively, excited acoustic modes are different.

FIG. 1 illustrates an example of BGSs in the $LP_{11}$ mode. FIG. 1(*a*) illustrates a BGS of acoustic modes excited in a case where both the pump light and the probe light are $LP_{11a}$. Furthermore, FIG. 1(*b*) illustrates a BGS of acoustic modes excited in a case where the pump light and the probe light are $LP_{11a}$ and $LP_{11b}$, respectively. From FIG. 1, it can be seen that the excited acoustic modes are different depending on difference in electric field distributions in the $LP_{11}$ mode of the pump light and the probe light. For example, in a case where both the pump light and the probe light are $LP_{11a}$ (the electric field distributions of the pump light and the probe light are the same), an $L_{01}$ mode exists among the excited acoustic modes, but in a case where the pump light and the probe light are $LP_{11a}$ and $LP_{11b}$, respectively (the electric field distributions of the pump light and the probe light are shifted from each other by 90 degrees centering the origin that is the center of the optical fiber), the $L_{01}$ mode does not exist among the excited acoustic modes.

Therefore, information related to overlap of the electric field distributions of the pump light and the probe light in the optical fiber can be acquired from an observed BGS. Note that, although the electric field distribution dependence of the BGSs in the $LP_{11}$ mode is illustrated as an example, actually, the overlap of the electric field distributions of the pump light and the probe light in other higher-order modes can also be acquired using a similar method, and the present invention can be applied to all of LP modes except for a fundamental mode.

[Acquisition of Variation Cycle of Electric Field Distribution in Higher-order Mode by Propagation]

Figure 2:
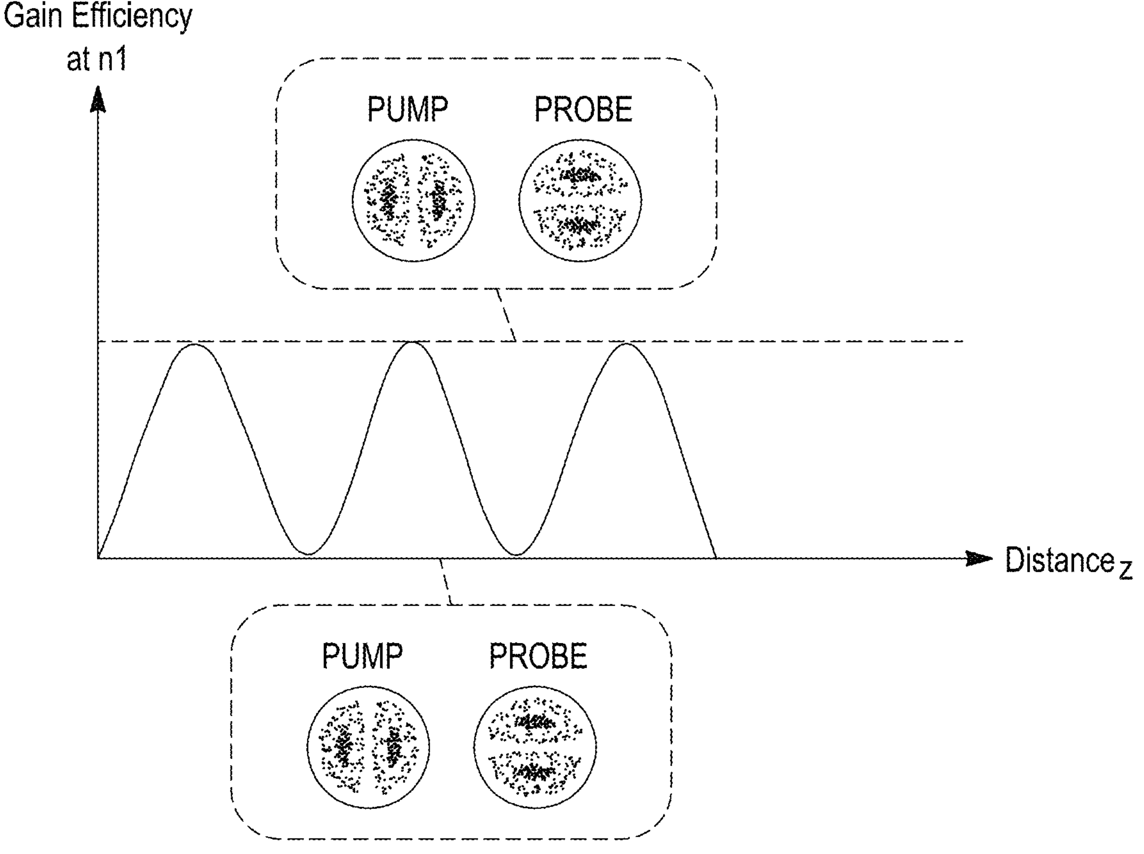
FIG. 2 is a diagram illustrating a concept of an electric field distribution variation cycle measuring method according to the present invention.

Although any acoustic mode of a BGS may be utilized in acquiring information related to overlap of the electric field distributions of the pump light and the probe light, here, attention is paid to the $L_{01}$ mode among excited acoustic modes as an example. As described above, from FIGS. 1(*a*) and (*b*), the peak state of the $L_{01}$ mode varies depending on relative relation between the electric field distributions of the pump light and the probe light. In the present invention, to utilize this characteristic, a variation in a gain amount at optical frequency difference $\nu_1$ of the peak of the $L_{01}$ mode (optical frequency difference between the pump light and the probe light) is acquired in the longitudinal direction. FIG. 2 illustrates a conceptual diagram in which a relative variation in the electric field distributions between the pump light and the probe light by propagation is acquired from BGSs. As illustrated in FIG. 2, the gain amount increases at the optical frequency difference $\nu 1$ at a point where the electric field distributions of the pump light and the probe light are the same, and on the other hand, the gain amount decreases when the electric field distributions are orthogonal. By the gain amount at the optical frequency difference $\nu 1$ being acquired in a distributed manner in the longitudinal direction of the optical fiber, a variation of the electric field distribution by propagation of the pump light and the probe light in the optical fiber can be acquired.

Note that the utilizing of the $L_{01}$ mode has the following advantage.

In actual measuring, a variation of the electric field distributions may be difficult to be obtained due to polarization dependence of a Brillouin gain. For example, a case where measurement is performed using optical frequency difference (optical frequency difference between the pump light and the probe light) at which a gain by an $L_{02}$ mode is generated will be considered. A gain generated in the $LP_{11a}$ mode and the $LP_{11a}$ mode is based on the $L_{02}$ mode and an $L_{21a}$ mode, but a gain generated in the $LP_{11a}$ mode and the $LP_{11b}$ mode is based only on an $L_{21b}$ mode. As described above, a generated gain varies depending on difference in electric field distributions of the $LP_{11}$ mode. Furthermore, a generated Brillouin gain also varies depending on difference in polarization between the pump light and the probe light. Therefore, even if a variation in the gain amount of an acoustic wave component is observed, whether the variation is due to the difference in the polarization or the difference in the electric field distributions may be difficult to be distinguished.

On the other hand, in a case where the measurement is performed at a frequency at which a gain by the $L_{01}$ mode is generated, the gain is generated in the $LP_{11a}$ mode and the $LP_{11a}$ mode, and the gain is not generated in the $LP_{11a}$ mode and the $LP_{11b}$ mode. Therefore, if the $L_{01}$ mode is utilized for the measurement (if the optical frequency difference between the pump light and the probe light is set to the optical frequency difference at which the $L_{01}$ mode is generated), there is an advantage that the influence due to the difference in the polarization can be reduced and the variation in the electric field distributions of the pump light and the probe light can be easily acquired.

[Measurement Procedure of BGS]

An example of an electric field distribution variation cycle measuring method of the present invention will be described below. In this method, to acquire overlap of electric field distributions of pump light and probe light, it is sufficient that the pump light is incident from one side of an optical fiber and the probe light is incident from the other side, and a BGS can be acquired. As a measuring method in which light is incident from both ends of an optical fiber and a BGS is acquired in a distributed manner in the longitudinal direction, a Brillouin optical time domain analysis method (BOTDA), a Brillouin optical correlation domain analysis method (BOCDA), and the like have been proposed, but in the present invention, any measuring unit can be used as long as a BGS can be measured. A performance example in a case of using the BOTDA will be described below.

(Performance Example) Measurement of stimulated Brillouin scattered light by counter propagation of pump light and probe light In the present performance example, an example will be described in which pump light and probe light having different frequencies are incident from both ends of an optical fiber, and a BGS of stimulated Brillouin scattered light generated by light collision is measured.

Figures 3, 4:
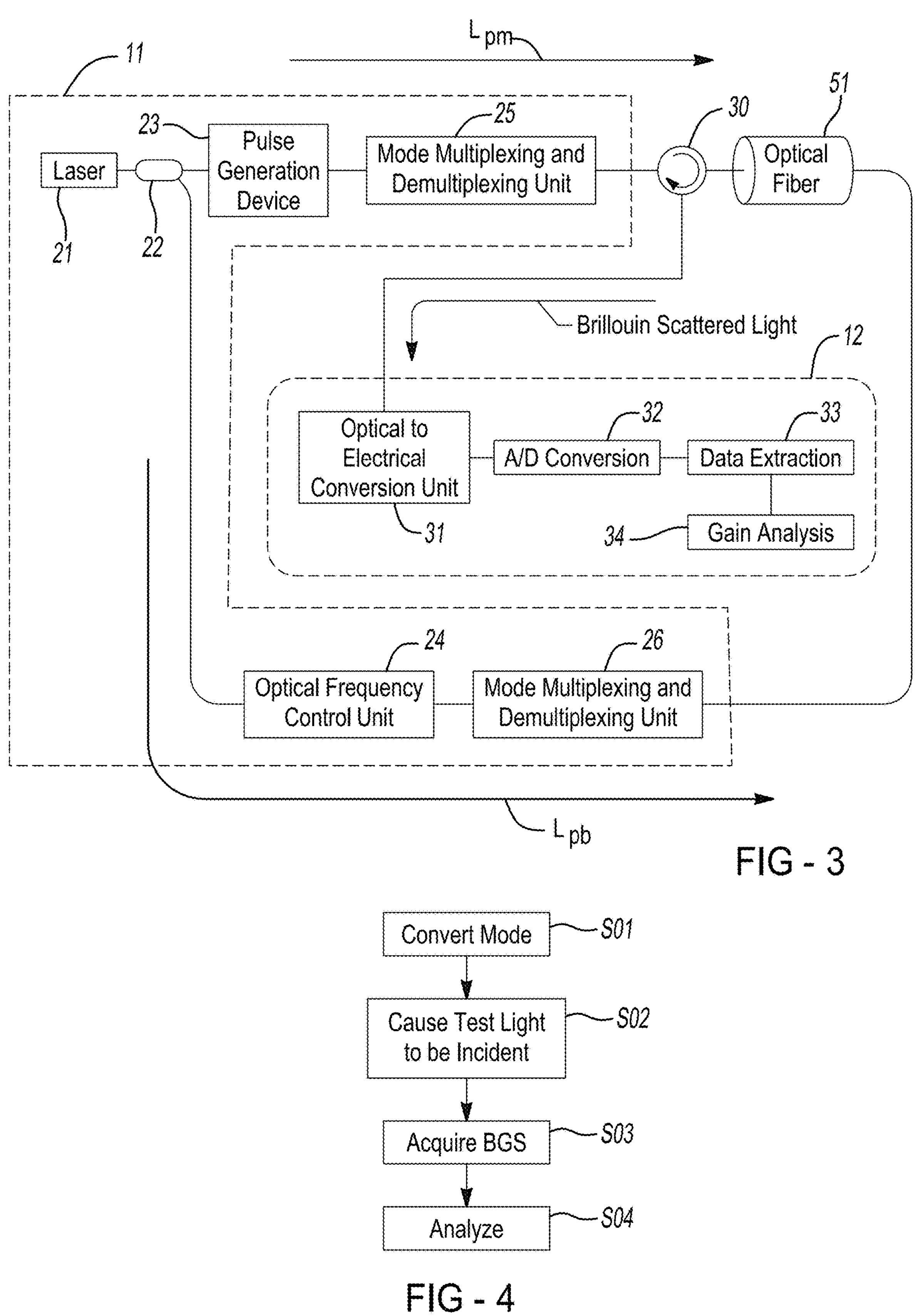
FIG. 3 is a diagram illustrating an electric field distribution variation cycle measuring apparatus according to the present invention.
FIG. 4 is a diagram illustrating an electric field distribution variation cycle measuring method according to the present invention.

FIG. 3 is a diagram illustrating an electric field distribution variation cycle measuring apparatus of the present embodiment. The present apparatus is an electric field distribution variation cycle measuring apparatus that measures a variation cycle of an electric field distribution of any higher-order mode propagating through an optical fiber 51, the electric field distribution variation cycle measuring apparatus including a test light incidence device 11 that converts pump light and probe light having predetermined optical frequency difference from the pump light into the any higher-order mode and causes the pump light to be incident on one end of the optical fiber 51 and the probe light to be incident on the other end of the optical fiber 51, and a gain analysis device 12 that acquires a Brillouin gain of stimulated Brillouin scattering generated when the pump light and the probe light collide in the optical fiber 51 in a distributed manner in a longitudinal direction of the optical fiber 51, and sets a variation cycle of the Brillouin gain in a longitudinal direction of the optical fiber 51 as a variation cycle of an electric field distribution of the any higher-order mode.

FIG. 4 is a flowchart illustrating an electric field distribution variation cycle measuring method performed by the present apparatus. The present method is an electric field distribution variation cycle measuring method for measuring a variation cycle of an electric field distribution of any higher-order mode propagating through an optical fiber 51, the electric field distribution variation cycle measuring method including converting pump light and probe light having predetermined optical frequency difference from the pump light into the any higher-order mode (step S01), causing the pump light to be incident on one end of the optical fiber and the probe light to be incident on the other end of the optical fiber (step S02), acquiring a Brillouin gain of stimulated Brillouin scattering generated when the pump light and the probe light collide in the optical fiber in a distributed manner in a longitudinal direction of the optical fiber (step S03), and setting a variation cycle of the Brillouin gain in a longitudinal direction of the optical fiber as a variation cycle of an electric field distribution of the any higher-order mode (step S04).

(Steps S01, S02)

In FIG. 3, light output from a laser light generation unit 21 that generates coherent light is converted into a desired wavelength by a wavelength varying unit, and then branched into two by a branching element 22. At this time, in a case where the laser light generation unit 21 can control a wavelength, the wavelength varying unit is unnecessary. One of the light branched into two is pump light $L_{pm}$, is pulsed by a pulse generation device 23, then converted from a fundamental mode to a propagation mode to be measured by a mode multiplexing and demultiplexing unit 25, and incident on a measuring target optical fiber 51.

The other branched light is probe light $L_{pb}$, and is given, by an optical frequency control device 24, frequency difference of about 10 to 11 GHz corresponding to a Brillouin frequency shift corresponding to a combination of modes of the pump light and the probe light incident on the measuring target optical fiber 51. The optical frequency control unit 24 is, for example, an external modulator such as a single-sideband (SSB) modulator formed from $LiNb_3$. Note that, instead of using the optical frequency control unit 24, two lasers having different frequencies (wavelengths) may be used, and the optical frequency difference between the two lasers may be controlled by using different light sources of the pump light and the probe light. The probe light $L_{pb}$ to which the frequency difference is given is converted to the propagation mode by a mode multiplexing and demultiplexing unit 26 similarly to the pump light, and is incident on the measuring target optical fiber 51 from the direction opposite to the pump light $L_{pm}$.

(Step S03)

In the measuring target optical fiber 51, a Brillouin gain is generated in the probe light $L_{pb}$ due to collision of the pump light $L_{pm}$ and the probe light $L_{pb}$. The probe light $L_{pb}$ amplified by the pump light $L_{pm}$ is transmitted to an optical to electrical conversion device 31 by an optical circulator 30. The optical to electrical conversion device 31 converts the intensity of the probe light $L_{pb}$ into an electrical signal, and an analog to digital (A/D) conversion device 32 converts the signal into digital data. A data extraction section 33 and a gain analysis section 34 analyze the Brillouin gain from this data.

A specific Brillouin gain analysis method is as follows. First, a reference intensity of the probe light $L_{pb}$ in a case where the pump light $L_{pm}$ is not incident is acquired. Thereafter, a signal intensity in a case where the pump light $L_{pm}$ and the probe light $L_{pb}$ are incident is acquired. Next, the Brillouin gain is acquired from the signal intensity and the reference intensity and the difference. By this operation being repeatedly performed while the optical frequency difference between the pump light and the probe light is changed, a BGS according to overlap of the electric field distributions of the pump light and the probe light as illustrated in FIG. 1 can be acquired.

(Step S04)

Furthermore, the BGS described above can be measured in a distributed manner in the longitudinal direction of the optical fiber 51. Therefore, the data extraction section 33 selects a mode of any acoustic wave component (for example, fundamental mode $L_{01}$) from the BGS (for example, fundamental mode $L_{01}$ that appears on the side of the lowest optical frequency difference of the BGS), and the gain analysis device 34 analyzes a variation in Brillouin gain efficiency of the mode in the longitudinal direction of the optical fiber 51 (a waveform as illustrated in FIG. 2 is obtained). The gain analysis device 34 sets the variation cycle of the Brillouin gain efficiency as the variation cycle of the electric field distribution of the propagation mode converted by the mode multiplexing and demultiplexing units (25, 26).

[Supplementary Note]

The measurement method and the apparatus of the present embodiment are described below.

(Object)

An object of the present invention is to provide an electric field distribution variation cycle measuring method capable of measuring, at a high speed, a variation cycle of an electric field distribution of a higher-order mode propagating through an optical fiber in the optical fiber in which a plurality of modes propagates.

(Units)

(1) The present method is an electric field distribution variation cycle measuring method for measuring a variation cycle of an electric field distribution of a higher-order mode propagating through an optical fiber, the method including utilizing a fact that a Brillouin gain spectrum of stimulated Brillouin scattered light generated when probe light incident from one end of an optical fiber and pump light incident from the other end collide with each other in the optical fiber depends on overlap of electric field distributions of the pump light and the probe light, and including a variation cycle evaluation unit for measuring a variation cycle of an electric field distribution varied by propagation from a longitudinal direction distribution of the Brillouin gain spectrum obtained by the measuring target optical fiber.

(2) In the above method (1), the variation cycle of the electric field distribution is measured from the longitudinal direction distribution of gain efficiency of an acoustic wave component depending on overlap of the electric field distributions utilizing difference in components of acoustic waves excited in a case where the electric field distributions of the pump light and the probe light are completely overlapped and in a case where the electric field distributions of the pump light and the probe light are orthogonal to each other.

(3) In the above method (1), gain efficiency of a fundamental mode of excited acoustic waves is measured in a distributed manner in a longitudinal direction, thereby measuring the variation cycle of the electric field distribution.

(4) The present apparatus includes a pump light and probe light generation unit that causes pump light and pump light to be incident on a measuring target optical fiber, an any mode incidence unit that causes the pump light and the probe light to be incident in any propagation mode in the target optical fiber, a spectrum measurement unit for measuring a Brillouin gain spectrum of stimulated Brillouin scattered light generated by pump light and probe light in the measuring target optical fiber, a spectrum distribution measurement unit for acquiring a spectrum obtained by the spectrum measurement unit in a distributed manner in a longitudinal direction, and an electric field distribution variation cycle analysis unit for acquiring a variation cycle of an electric field distribution of a mode propagating through an optical fiber from a spectral distribution obtained by the spectral distribution measurement unit.

(Effects)

In the present invention, a Brillouin gain spectrum of stimulated Brillouin scattered light generated by pump light and probe light in an FMF is measured by a photodetector. Since the spectrum depends on overlap of electric field distributions of the pump light and the probe light, the spectrum is measured in a distributed manner in the longitudinal direction, thereby measuring a variation cycle of an electric field distribution of a higher-order mode propagating through an optical fiber. Furthermore, the present invention allows measurement to be performed at a higher speed than measurement by a measuring method using a conventional image sensor.

The invention claimed is:

1. An electric field distribution variation cycle measuring method for measuring a variation cycle of an overlap of an electric field distribution between first and second higher-order modes propagating through an optical fiber, the electric field distribution variation cycle measuring method comprising:

converting pump light into the first higher-order mode and converting probe light having a predetermined optical frequency difference from the pump light into the second higher-order mode;

causing the pump light to be incident on one end of the optical fiber and the probe light to be incident on the other end of the optical fiber;

receiving, at the one of the optical fiber, the probe light in the state of the second higher-order mode after passing through the optical fiber and including a stimulated Brillouin scattering generated when the pump light and the probe light collide in the optical fiber in a distributed manner in a longitudinal direction of the optical fiber;

acquiring a Brillouin gain of a desired acoustic wave mode of the stimulated Brillouin scattering; and setting a variation cycle of the Brillouin gain in the longitudinal direction of the optical fiber as the variation cycle of the overlap of the electric field distribution between the first and second higher-order modes.

2. The electric field distribution variation cycle measuring method according to claim 1, wherein the desired acoustic wave mode is a fundamental mode.

3. An electric field distribution variation cycle measuring apparatus that measures a variation cycle of an overlap of an electric field distribution between first and second higher-order modes propagating through an optical fiber, the electric field distribution variation cycle measuring apparatus comprising:

a mode multiplexing and demultiplexing device that converts pump light into the first higher-order mode and converts probe light having a predetermined optical frequency difference from the pump light into the second higher-order mode and causes the pump light to be incident on one end of the optical fiber and the probe light to be incident on the other end of the optical fiber; and a gain analysis device that receives, at one end of the optical fiber, the probe light in the state of the second higher-order mode after passing through the optical fiber and including a stimulated Brillouin scattering generated when the pump light and the probe light collide in the optical fiber in a distributed manner in a longitudinal direction of the optical fiber, acquires a Brillouin gain of a desired wave mode of the stimulated Brillouin scattering, and sets a variation cycle of the Brillouin gain in the longitudinal direction of the optical fiber as the variation cycle of the overlap of the electric field distribution between the first and second higher-order modes.

4. The electric field distribution variation cycle measuring apparatus according to claim 3, wherein the desired wave mode is a fundamental mode.

* * * * *